United States Patent [19]

Ohuchi

[11] Patent Number: 4,503,343
[45] Date of Patent: Mar. 5, 1985

[54] ACTIVE PULL-UP CIRCUIT

[75] Inventor: Kazunori Ohuchi, Yokohama, Japan

[73] Assignee: Tokyo Shibaura Denki Kabushiki Kaisha, Japan

[21] Appl. No.: 423,295

[22] Filed: Sep. 24, 1982

[30] Foreign Application Priority Data

Jan. 14, 1982 [JP]  Japan .................................. 57-4732

[51] Int. Cl.³ .......................... G11C 7/00; H03K 5/05; H03K 17/693
[52] U.S. Cl. .................................... 307/482; 307/269; 307/443; 307/453; 307/578; 365/203
[58] Field of Search ................ 307/443, 453, 481–482, 307/577–578, 583, 269; 365/203, 204

[56] References Cited

U.S. PATENT DOCUMENTS

| 4,347,448 | 8/1982 | Plachno .......................... 307/578 X |
| 4,352,996 | 10/1982 | White, Jr. ............................ 307/269 |
| 4,398,100 | 8/1983 | Tobita et al. ................... 307/482 X |
| 4,417,329 | 11/1983 | Mezawa et al. ................ 307/453 X |

OTHER PUBLICATIONS

Arzubi, "High-Speed, Low-Power Inverter", IBM Tech. Disc. Bull., vol. 17, No. 10, Mar. 1975, p. 2834.
ISCC Digests of Technical Papers, 1979, p. 144–145, A 5V-only 2Kx8 Dynamic RAM by S. S. Eaton.

Primary Examiner—Stanley D. Miller
Assistant Examiner—David R. Hudspeth
Attorney, Agent, or Firm—Finnegan, Henderson, Farabow, Garrett & Dunner

[57] ABSTRACT

Provided is an active pull-up circuit which comprises a MOS capacitor having one end connected to an input terminal receiving a pull-up signal, a first MOS transistor having a current path connected between the other end of said MOS capacitor and a signal line precharged, during a precharge period, up to a power source voltage level, and a second MOS transistor having a current path connected between a power source terminal and the signal line and having a gate connected to a source of the first MOS transistor. To the gate of this first MOS transistor there is applied a control voltage which, during the precharge period, is higher in level than a sum of the power source voltage and a threshold voltage of the first MOS transistor and, after the lapse of the precharge period, is substantially equal in level to the power source voltage.

3 Claims, 16 Drawing Figures

ACTIVE PULL-UP CIRCUIT

BACKGROUND OF THE INVENTION

This invention relates to an active pull-up circuit.

The progress of a circuit integration technique in recent years is remarkable. For example, an LSI memory circuit of large capacity has been developed and, particularly in the field of dynamic type memory devices, a memory of 64k bit capacity has been manufactured on a mass-production basis, and further a memory of 256k bit capacity is now being developed. The development of these memories of such a large capacity owes greatly to the development of various new semiconductor elements such as a memory cell comprised of a single transistor and a single capacitor, a memory cell of two-layer polycrystalline silicon structure, a dynamic type ratioless sense amplifier using a flip-flop circuit, or the like. When, for example, a random access memory (RAM) is constructed using dynamic type ratioless sense amplifiers, the power consumption in this RAM can be made or kept small but, on the other hand, the logical "1" level of the read data sensed and amplified undesirably decreases. In case of a memory of 4k bit or 16k bit capacity driven with a power source voltage of +12 V to handle data having a sufficiently large logical amplitude, reduction in logical level of the data "1" had no important effect upon the operation of that memory. In case of a memory of 64k bit capacity driven by application of a power source voltage of as low as +5 V to handle data of small logical amplitude, however, reduction in logical level of the data "1" may affect the operation of that memory. That is, where the data "1" decreased in logical level is stored in a memory cell, it is possible that when the data "1" is next read out from this memory cell, an erroneous operation occurs. To prevent the erroneous operation, it is necessary to recover the logical level of the data "1" decreased in logical amplitude up to the original "1" level and increase only the voltage on that one of paired bit lines of the sense amplifier which holds a "1" level signal. To this end, an active pull-up circuit has been adopted.

FIG. 1 shows part of a dynamic RAM circuit using a prior art active pull-up circuit. This memory circuit is comprised of a dynamic type ratioless sense amplifier 2 having a flip-flop circuit, a pair of bit lines B0 and B1 respectively connected to bistable output terminals N0 and N1 of this flip-flop circuit, a dummy cell DC0 and an N number of memory cells MC-01 to MC-0N connected to the bit line B0, a dummy cell DC1 and an N number of memory cells MC-11 to MC-1N connected to the bit line B1, active pull-up circuits 4 and 6 respectively connected to the bit lines B0 and B1, and MOS transistors TR0 and TR1 whose conduction states are controlled by the output signals CS0 and CS1 from a column decoder (not shown), respectively, and which have their current paths connected between the bit line B0 and an I/O terminal D0 and between bit line B1 and an I/O terminal D1, respectively.

The ratioless sense amplifier 2 is comprised of MOS transistors TR2 and TR3 having their current paths connected between a power source terminal VC and a node N0 and between the power source terminal VC and a node N1, respectively, MOS transistors TR4 and TR5 having their current paths connected between the node N0 and a drive terminal VD and between the node N1 and the drive terminal VD respectively, and a MOS transistor TR6 having its current path connected between the nodes N0 and N1. The MOS transistors TR2, TR3 and TR6 have their gates connected to a precharge terminal VP, while the MOS transistors TR4 and TR5 have their gates respectively connected to the nodes N1 and N0.

The active pull-up circuit 4 is comprised of a MOS capacitor C0 connected between a pull-up terminal VPL and a node N2, a MOS transistor TR7 having a gate connected to the power source terminal VC and a current path connected between the node N2 and the bit line B0, and a MOS transistor TR8 having a gate connected to the node N2 and a current path connected between the power source terminal VC and the bit line B0. The active pull-up circuit 6 is comprised of a MOS capacitor C1 connected between the pull-up terminal VPL and a node N3, a MOS transistor TR9 having a gate connected to the power source terminal VC and a current path connected between the node N3 and the bit line B1, and a MOS transistor TR10 having a gate connected to the node N3 and a current path connected between the power source terminal VC and the bit line B1.

Each of the dummy cells DC0 and DC1 and memory cells MC-01 to MC-0N, and MC-11 to MC-1N is comprised of a capacitor having one end connected to the power source terminal VC and a MOS transistor having a gate connected to a corresponding word line and a current path connected between the other end of this capacitor and the bit line B0 or B1.

The MOS capacitors C0 and C1 are each of a MOS structure wherein its gate is connected to the corresponding node N2 or N3 while its drain and source are both connected to the corresponding pull-up terminal VPL.

There will now be described the operation of the memory circuit shown in FIG. 1 with reference to the signal waveforms shown in FIGS. 2A to 2F.

During the precharge period, a precharge voltage $\phi P$ shown in FIG. 2A, applied to the precharge terminal VP, is kept at a high level which is equal to or higher than a level (VCC+VTH) (where VCC represents the power source voltage and VTH the threshold voltage of the MOS transistor used), while the word selection signal shown in FIG. 2B is kept at a low level. In this state, the MOS transistors TR2, TR3 and TR6 are kept conductive and the bit lines B0 and B1 are precharged to a high level of VCC as shown in FIG. 2E. In this case, the nodes N2 and N3 are precharged, through the MOS transistors TR7 and TR9, up to a potential level (VCC-VTH) as shown in FIG. 2F and are kept at this potential level.

When the precharge period lapses, the precharge voltage $\phi P$ is first set to a low level to make ready for the reading operation. Thereafter, word selection signals supplied to the word lines respectively connected, for example, to the memory cell MC-01 and the dummy cell DC1 are set at a high level as shown in FIG. 2B. Subsequently, a drive signal $\phi D$ applied to the drive terminal VD is set at a low level as shown in FIG. 2C. Assume now that the memory cell MC-01 is stored with a data "1" and potentials on the bit lines B0 and B1 will be set at "1" levels, respectively. When the word selection signal is increased to the high level, the potential of the bit line B0 remains unchanged as indicated by a solid line in FIG. 2E but the potential of the bit line B1 decreases slightly as shown by a broken line in FIG. 2E. Thereafter, as the drive signal $\phi D$ gradually decreases toward a level 0V, the conduction resistance of the MOS transistor TR5 becomes small as compared with that of the MOS transistor TR4 with a result that the potential of the bit line B1 decreases in level at a rate higher than that at which the potential of the bit line B0 decreases. If, in this case, the amount of decrease in level of the potential on the bit line B0 is smaller than the threshold voltage VTH, then the MOS transistor TR7 is kept nonconductive while the potential of the node N2 is kept at the level (VCC-VTH) as shown by a solid line in FIG. 2F. Since, on the other hand, the potential of the bit line B1 decreases, at a high rate, down to the level of 0V, the MOS transistor TR9 is rendered conductive with a result that the potential of the node N3 decreases down to the level of 0V as shown by a broken line in FIG. 2F. When, thereafter, a pull-up signal $\phi$PL applied to the pull-up terminal VPL is set to a high level as shown in FIG. 2D, since in this case the gate of the MOS capacitor C0 is applied with a voltage high enough to form a channel path and this capacitor C0 has a large capacitance, the potential of the node N2 is pulled up through that MOS capacitor C0. As a result, the potential on the node N2 is set to a level higher than the power source voltage VCC as shown in FIG. 2F. In contrast, the potential of the node N3 is kept at the 0V level since the MOS capacitor C1 has no channel path formed therein, and the electrostatic coupling capacitance of that MOS capacitor C1 remains to be small. Accordingly, even when the pull-up signal $\phi$PL becomes high in level, the potential of the node N3 is not pulled up. Further, in this case, even when the potential of the node N3 is not set at 0V and the MOS capacitor C1 has an inverted layer formed therein to obtain a sufficiently large electrostatic coupling capacitance, the potential of the node N3 is kept at its low level and is then decreased down to the 0V level since the MOS transistor TR9 is kept conductive.

In this way, where the data signals "1" and "0" are respectively read onto the bit lines B0 and B1, the MOS transistor TR8 is rendered fully conductive and the MOS transistor TR10 is rendered nonconductive. As a result, only the active pull-up circuit 4 operates to set the potential of the bit line B0 to the "1" level, while the active pull-up circuit 6 is kept in a non-operative state. Where the data signal "0" and "1" are read respectively onto the bit lines B0 and B1, the active pull-up circuit 6 operates to set the potential of the bit line B1 to the "1" level while, the active pull-up circuit 4 is kept in the non-operative state.

In this way, after the potentials of the bit lines B0 and B1 are set, respectively, to the levels VCC and 0V, the MOS transistors TR0 and TR1 are both rendered conductive by the column selection signals CS0 and CS1 from the column decoder (not shown) with a result that the data signals "1" and "0" on the bit lines B0 and B1 are taken out from the I/O terminals D0 and D1, respectively.

As mentioned above, the active pull-up circuits are used to attain a stable and reliable data reading/writing operation in the dynamic RAM circuit operating with a low source voltage in particular.

Meanwhile, the power source voltage used in a semiconductor integrated circuit is generally permitted to have a variation of ±10%. That is, an ordinary semiconductor integrated circuit is required to be designed to properly operate even when the power source voltage varies in level within a range of ±10%. However, the active pull-up circuits 4 and 6 used in the dynamic RAM circuit shown in FIG. 1 are affected by such variation in the power source voltage, followed by a possibility of having an undesirable effect upon the memory operation of the RAM circuit.

Assume now that the power source voltage VCC of the VCH level is applied to the power source terminal VC in the dynamic RAM circuit shown in FIG. 1 and, after the precharging operation is sufficiently performed, that power source voltage is inadvertently lowered from the VCH level to the VCL (<VCH) level. In this case, the precharge signal $\phi$P has a "1" level and then decreases from its (VCH+VTH) level toward a (VCL+VTH) level. However, since this precharge signal $\phi$P is kept at a level higher than the VCL level, the MOS transistors TR2 and TR3 are both rendered conductive and the potentials of the bit lines B0 and B1 decrease from the VCH level toward the VCL level. Since the power source voltage VCC is applied to the gates of the MOS transistors TR7 and TR9, the MOS transistors TR7 and TR9 are still kept nonconductive even when the potentials of the bit lines B0 and B1 come to have the VCL level. Accordingly, the potentials of the nodes N2 and N3 are not varied whatsoever but kept at the level of (VCH-VTH). In this case, where the amount of variation $\Delta$VCC (=VCH-VCL) of the power source voltage VCC is greater than 2VTH, the MOS transistors TR8 and TR10 are rendered conductive, resulting in that the potentials of the bit lines B0 and B1 decrease, at a higher rate, toward the VCL level.

Next, assume that, after the precharging operation has been completed, i.e., while the precharge signal $\phi$P is kept at the 0V level, the power source voltage VCC vary from the VCH level to the VCL level. Since, also in this case, the MOS transistors TR7 and TR9 are both kept nonconductive, the potentials of the nodes N2 and N3 are kept at the (VCH-VTH) level. If, in this case, the amount of variation $\Delta$VCC of the power source voltage VCC is greater than 2VTH, the MOS transistors TR8 and TR10 are rendered conductive with a result that the potentials of the bit lines B0 and B1 decrease toward the VCL level. Normally, immediately after the precharge signal $\phi$P is set to the 0V level, the drive signal $\phi$D is set to the 0V level to start the sensing and amplifying operation of the ratioless sense amplifier 2. For this reason, since the amount of decrease in the potentials of the bit lines B0 and B1 is sufficiently small or the potentials of the bit lines B0 and B1 are sensed and amplified by the ratioless sense amplifier 2, the effect due to that decrease in the potentials of the bit lines B0 and B1 toward the VCL level can be ignored.

As stated above, when the power source voltage VCC decreases from the VCH level to the VCL level, the potentials of the nodes N2 and N3 do not vary but are kept at the (VCH-VTH) level. Assume now that the data "1" is read out from the memory cell MC-01 onto the bit line B0 and the data "0" is read out from the dummy cell DC1 onto the bit line B1. In the RAM circuit of 64k bit capacity, the potential difference between the bit lines B0 and B1 set to the "0" and "1" levels, respectively, is usually set to approximately 100 to 200 mV. If, at this time, the amount of variation $\Delta$VCC in the power source voltage VCC is greater than 2VTH, the MOS transistors TR8 and TR10 are kept conductive. Thus, the potentials of the bit lines B0 and B1 lowered from the VCL level when the data were read out from the memory cell MC-01 and dummy cell DC1, increase again toward that VCL level. Thus, the difference between the potentials of the bit lines B0 and B1 becomes smaller than that which existed immediately after the commencement of the data reading operation. When this potential difference becomes so small that it can not be sensed by the ratioless sense amplifier 2, the sense amplifier 2 will not sense the data even if the drive signal $\phi D$ is made 0V to set the sense amplifier 2 in the operating state, thus causing an erroneous operation. Further, in this case, even if the potential difference between the bit lines B0 and B1 is properly sensed by the sense amplifier 2, a long time is required to amplify that potential difference to a sufficiently large value. Further, in this case, the MOS transistors TR8 and TR10 are kept in conduction, so that the potential of the node N1 is determined in accordance with the ratio between the conduction resistances of the MOS transistors TR5 and TR10. Therefore, it will take a long time to set the potential of the node N1 to the "0" level. In this case, therefore, it is possible that the pull-up signal $\phi PL$ comes to have the "1" level before the potential of the node N3 is decreased to a small value which causes the aforesaid inverted layer in the MOS capacitor to disappear. In this case, the potential of the node N3 is also pulled up with a result that the conduction resistance of the MOS transistor TR10 is made small as well as the conduction resistance of the MOS transistor TR8. As a result, the timing of setting the potential of the node N1 to the "0" level is delayed and, when in this state the MOS transistors TR0 and TR1 are rendered conductive by the column selection signals CS0 and CS1 respectively, an erroneous data may be read out from the I/O terminals D0 and D1.

Further, if the amount of variation $\Delta VCC$ in the power source voltage VCC is smaller than 2VTH, no problem will arise immediately after the commencement of the amplifying operation since the MOS transistors TR8 and TR10 are both kept nonconductive. However, when the potential of the bit line B1 is slightly lowered in the amplifying operation, the MOS transistor TR10 may be rendered conductive, causing the above-mentioned erroneous operation.

When the reading operation have been properly performed in a memory cycle immediately succeeding to the variation of the power source voltage VCC from the VCH level to the VCL level, the potentials of the nodes N2 and N3 are kept at the (VCH−VTH) and 0V levels, respectively. When the drive signal $\phi D$ and the precharge signal $\phi P$ are set to the "1" level to perform a precharging operation for the next memory cycle, the bit lines B0 and B1 are both set to the VCL level and the node N3 is set to the (VCL−VTH) level. In this case, since the potential of the bit line B0 is kept apart from the "0" level, the MOS transistor TR7 is still kept nonconductive and the potential of the node N2 is still kept at the (VCH−VTH) level. Assume now that, in this state, a data causing the bit lines B0 and B1 to be set respectively to the "0" and "1" levels is read out from the memory cell MC-11 and dummy cell DC0. If, in this case, the amount of variation $\Delta VCC$ is greater than 2VTH, the MOS transistors TR8 and TR10 are rendered conductive and nonconductive, respectively. As a result, the bit line B0 is charged, through this MOS transistor TR8, to the VCL level. Accordingly, the potential difference between the bit lines B0 and B1 is rapidly reduced to such an extent that it can not be sensed by the sense amplifier 2, causing an erroneous operation. Even if, in this case, the drive signal $\phi D$ is set to the "0" level before the potential difference becomes so small that it can not be sensed by the sense amplifier 2, the bit lines B0 and B1 are liable to become "1" and "0" levels, respectively since the MOS transistors TR8 and TR10 are respectively kept conductive and nonconductive. This causes an erroneous operation to occur easily.

Further, if, in the above case, the amount of variation $\Delta VCC$ is smaller than 2VTH, no problem will arise immediately after the commencement of the amplifying operation of the ratioless sense amplifier 2 since the MOS transistors TR8 and TR10 are both kept nonconductive. However, since the MOS transistor TR8 is applied with a gate voltage higher than that applied to the MOS transistor TR10, the MOS transistor TR8 becomes conductive earlier than the MOS transistor TR10 when the potentials of the bit lines B0 and B1 decrease. As a result, the potential of the bit line B0 will decrease gently, causing an erroneous operation. As mentioned above, the potential of the node N2 or N3 is kept at the (VCH−VTH) level even if the reading operation is normally carried out in the initial memory cycle after the power source voltage VCC varies from the VCH level to the VCL level. For this reason, it becomes difficult, in the succeeding memory cycle, to properly read data having an inverted relation with respect to the data read onto the bit lines B0 and B1 by the reading operation in the initial memory cycle.

SUMMARY OF THE INVENTION

Accordingly, an object of the invention is to provide an active pull-up circuit which is difficultly affected by the variation of the power source voltage.

According to one aspect of the invention, there is provided an active pull-up circuit comprising capacitive means having one end connected to an input terminal for receiving a pull-up signal, a first MOS transistor having a current path connected between the other end of the capacitive means and a signal line precharge during a precharge period to a power source voltage level, a second MOS transistor having a current path connected between a power source terminal and the signal line and a gate connected to a junction between the capacitive means and first MOS transistor, and control means for supplying to a gate of the first MOS transistor a voltage which, during the precharge period, is set higher than the sum of the power source voltage and the threshold voltage of the first MOS transistor and, after the lapse of the precharge period, is set substantially equal to the power source voltage.

BRIEF DESCRIPTION OF THE DRAWINGS

FIGS. 4A to 4H show signal waveforms for explaining the operation of the dynamic RAM circuit shown in FIG. 3.

DETAILED DESCRIPTION OF THE PREFERRED EMBODIMENT

Figure 1:
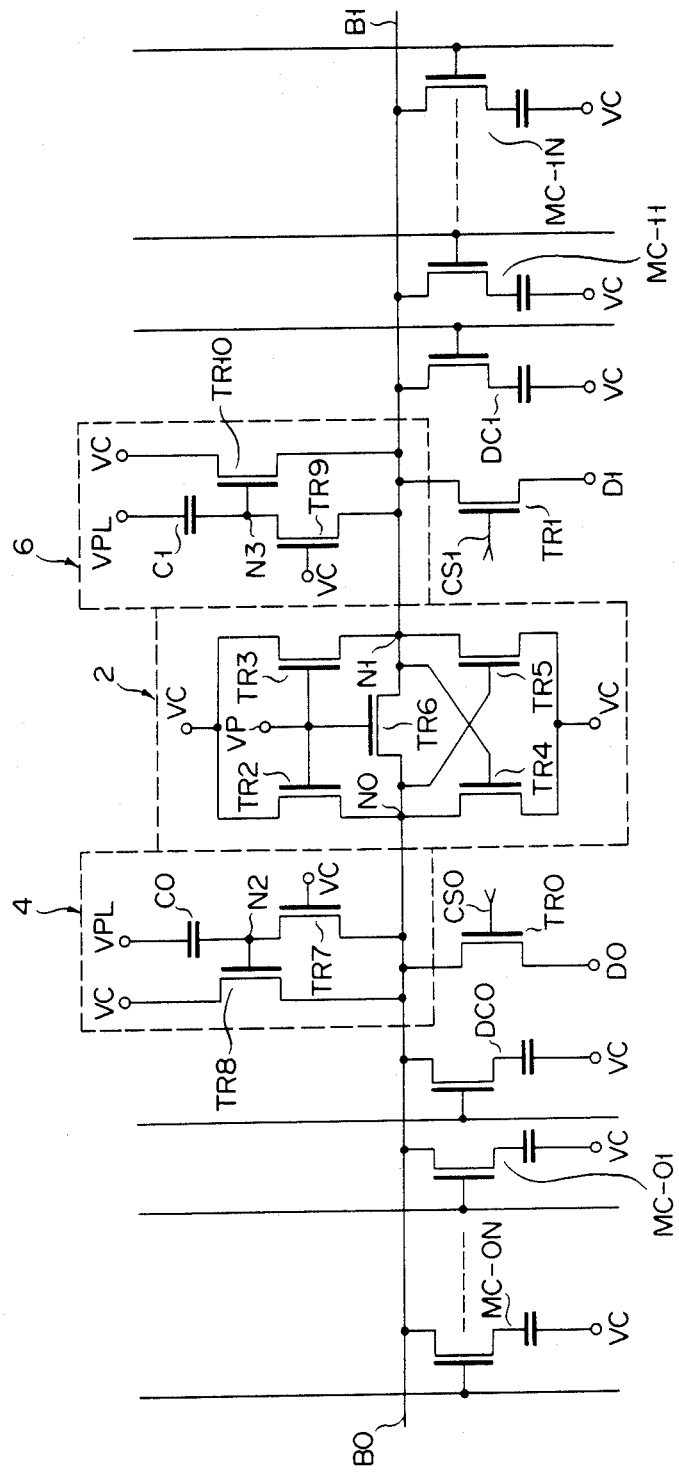
FIG. 1 shows a dynamic RAM circuit including a prior art active pull-up circuit.
Figure 2:
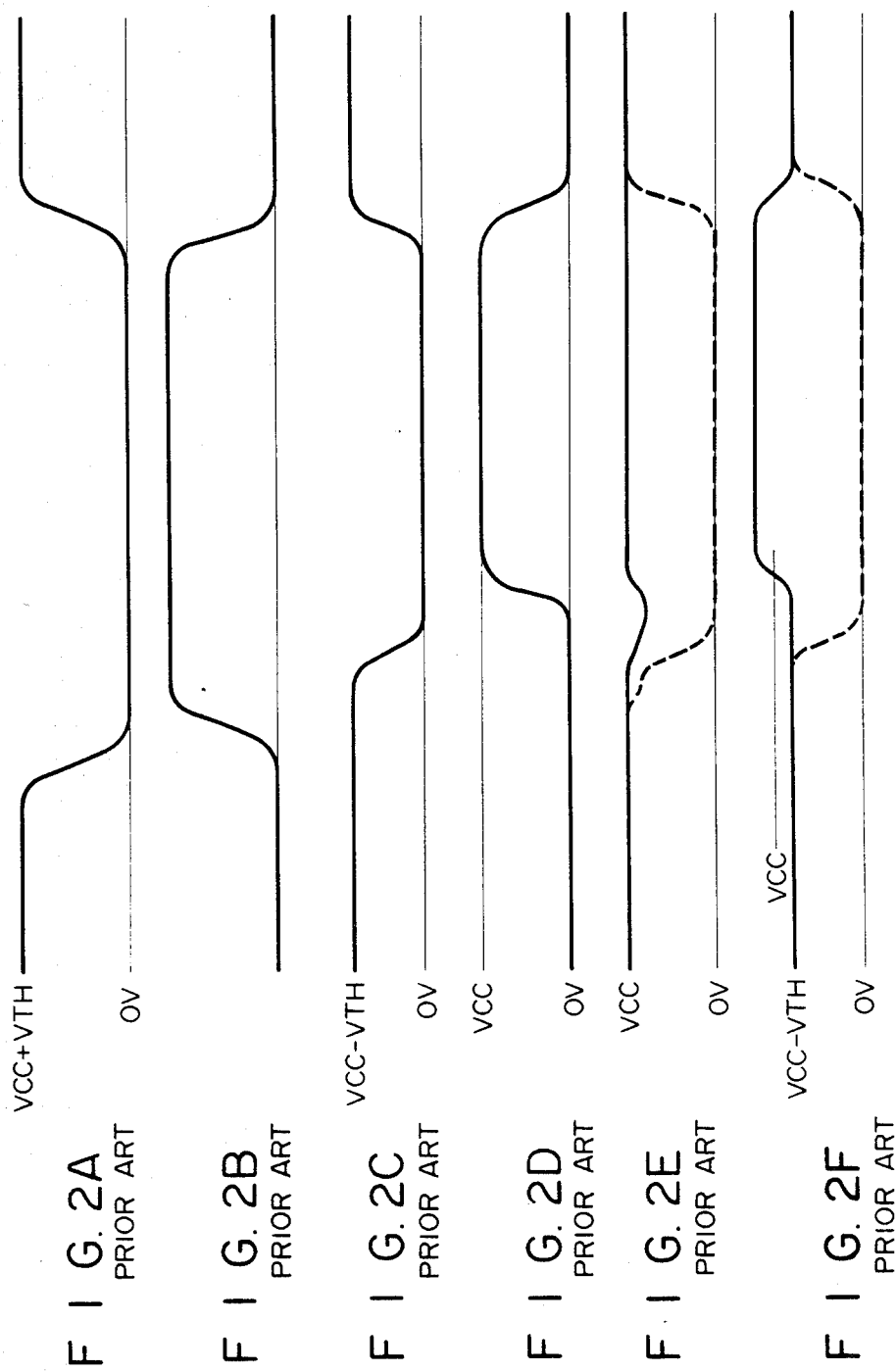
FIGS. 2A to 2F show signal waveforms for explaining the operation of the dynamic RAM circuit shown in FIG. 1.
Figure 3:
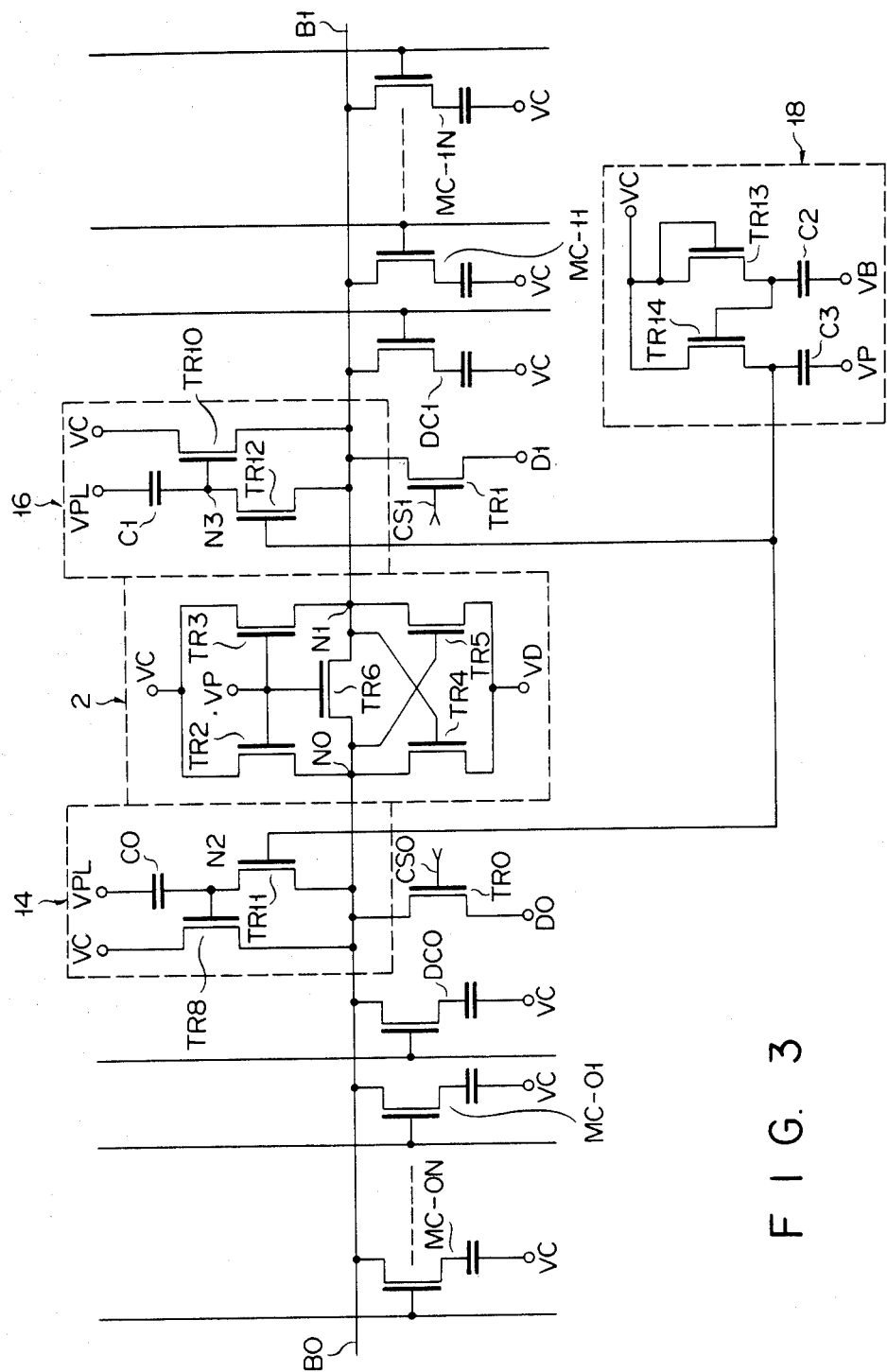
FIG. 3 shows a dynamic RAM circuit using an active pull-up circuit according to an embodiment of the invention.

FIG. 3 shows a RAM circuit including an active pull-up circuit according to an embodiment of the invention. This RAM circuit has the following circuit sections respectively constructed in the same manner as those shown in FIG. 1. That is, the RAM circuit includes a dynamic type ratioless sense amplifier 2 having a flip-flop circuit, bit lines B0 and B1 connected respectively to bistable output terminals N0 and N1 of the flip-flop circuit, a dummy cell DC0 and an N number of memory cells MC-01 to MC-0N connected to the bit line B0, and a dummy cell DC1 and an N number of memory cells MC-11 to MC-1N connected to the bit line B1. The RAM circuit further includes active pull-up circuits 14 and 16 connected respectively to the bit lines B0 and B1, and a control circuit 18 for controlling the active pull-up circuits 14 and 16.

The active pull-up circuit 14 is formed of a MOS capacitor C0 connected between a pull-up terminal VPL and a node N2, a MOS transistor TR11 having a gate connected to the control circuit 18 and having a current path connected between the node N2 and bit line B0, and a MOS transistor TR8 having a gate connected to the node N2 and a current path connected between a power supply terminal VC and the bit line B0. The active pull-up circuit 16 is formed of a MOS capacitor C1 connected between the pull-up terminal VPL and a node N3, a MOS transistor TR12 having a gate connected to the control circuit 18 and a current path connected between the node N3 and bit line B1, and a MOS transistor TR10 having a gate connected to the node N3 and a current path connected between the power supply terminal VC and the bit line B1. The control circuit 18 is formed of a MOS transistor TR13 having its gate and drain connected to the power supply terminal VC, a capacitor C2 connected between a source of the transistor TR13 and a control terminal VB to which a control signal $\phi B$ is supplied from a control signal generator (not shown), a MOS transistor TR14 having a gate connected to the source of the MOS transistor TR13 and having a drain connected to the power supply terminal VC, and a capacitor C3 connected between the source of the transistor TR14 and a precharge terminal VP. The source of the MOS transistor TR14 is connected, as an output terminal, to the gates of the MOS transistors TR11 and TR12.

There will now be described the operation of the RAM circuit shown in FIG. 3 with reference to FIGS. 4A to 4H.

Figures 4A, 4B, 4C, 4D, 4E, 4F, 4G, 4H:
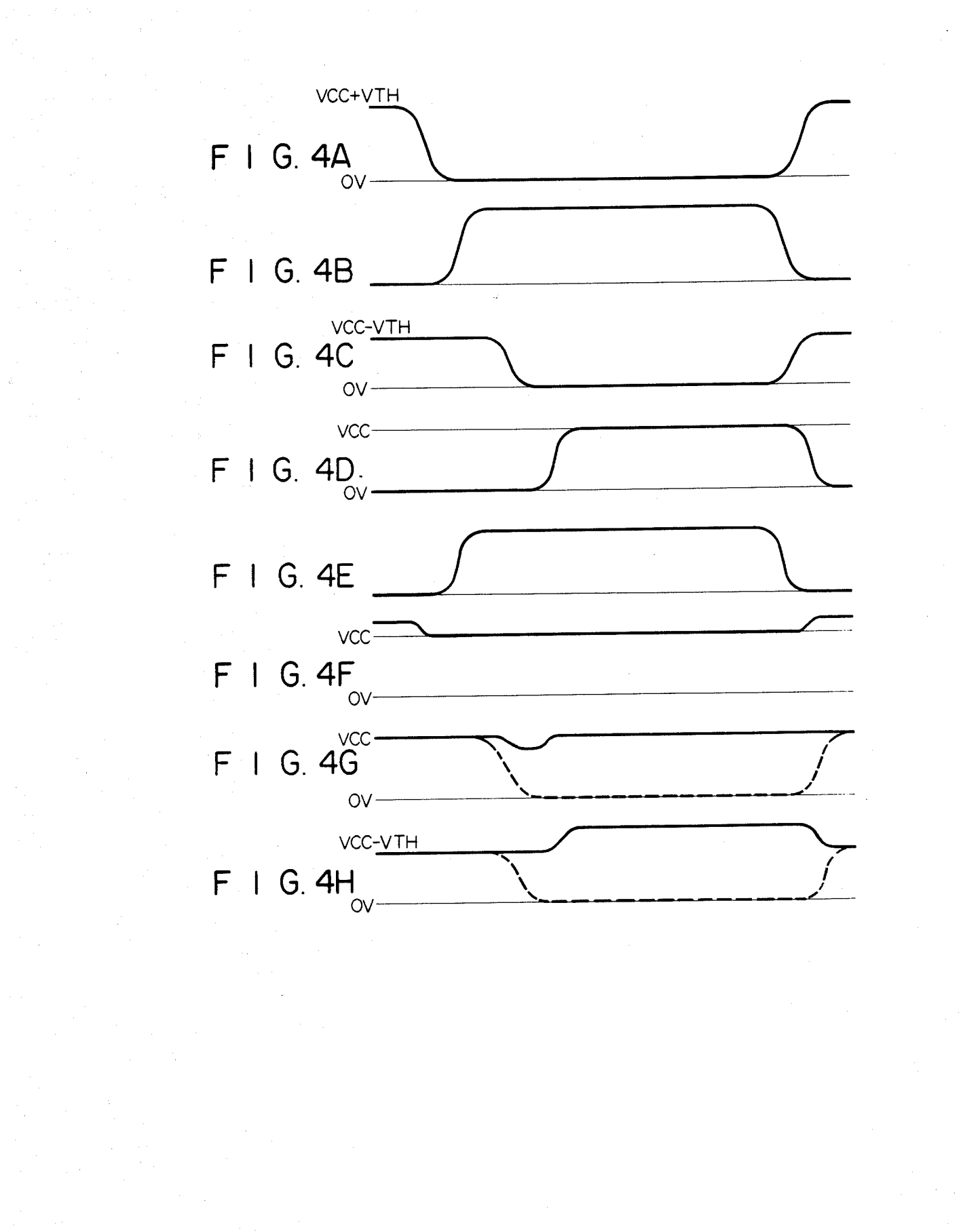

When the precharge signal $\phi P$ shown in FIG. 4A has a low level and the control signal $\phi B$ shown in FIG. 4E and supplied to the control terminal VB has a high level, a gate voltage higher than a level (VCC+VTH) is applied to the gate of the MOS transistor TR14, so that an output signal of VCC level shown in FIG. 4F is produced from the control circuit 18. Thereafter, when the control signal $\phi B$ is set to a low level and the precharge signal $\phi P$ is set to a high level, an output voltage signal higher than the level (VCC+VTH) is produced from the control circuit 18. This high level voltage is kept at the high level until the precharge signal $\phi P$ is set to a low level. Accordingly, during the precharging period, the MOS transistors TR11 and TR12 are rendered conductive with a result that the potential of the nodes N2 and N3 is kept at the VCC level.

When the reading operation is carried out, the precharge signal $\phi P$ is set to a low level as shown in FIG. 4A. Thus, an output voltage of VCC level is applied to the gates of the MOS transistors TR11 and TR12 and as a result the reading operation is executed in the same manner as in the RAM circuit shown in FIG. 1. That is, a word selection signal of high level shown in FIG. 4B is thereafter supplied to word lines as selected, and the drive signal $\phi D$ is set to a low level as shown in FIG. 4C. Assume now that data "1" is read out from the memory cell MC-01. Then, the potentials of the bit lines B0 and B1 are set to "1" and "0" as shown in FIG. 4F by a solid line and a broken line, respectively. In this case, the MOS transistors TR11 and TR12 are rendered nonconductive and conductive, respectively, and the nodes N2 and N3 are set to "1" and "0" levels, respectively, as shown by a solid line and a broken line in FIG. 4H. When, at this time, the pull-up signal $\phi PL$ is set to a high level as shown in FIG. 4D, the potential at the node n2 is pulled up by the electrostatic capacitive coupling of the MOS capacitor and becomes higher than the VCC level as shown by a solid line in FIG. 4H. Since, on the other hand, the potential at the node N3 is "0" level, it is kept to be "0" level even when the pull-up signal $\phi PL$ is increased to the high level.

In this way, the potentials of the bit lines B0 and B1 are stably set to the VCC level and 0V level, respectively, and thereafter, in accordance with the column selection signals CS0 and CS1 from a column decoder (not shown), the "1" and "0" level signals on the bit lines B0 and B1 are read from I/O terminals D0 and D1.

Assume now that, during the operation of the RAM circuit shown in FIG. 3, the power source voltage VCC has varied from a high potential level VCH to a low potential level VCL. Since, during the precharge period, the gates of the MOS transistors TR11 and TR12 are supplied with a voltage higher than the (VCC+VTH) level, the potentials of the nodes N2 and N3 are kept at the VCh level prior to the fluctuation of the power source voltage VCC. Further, since the MOS transistors TR11 and TR12 are both kept conductive even after the power source voltage VCC has varied to the VCL level, the potentials of the nodes N2 and N3 are set to the VCL level. In this way, the potentials of the nodes N2 and N3 are set following the potentials of the bit lines B0 and B1 varying with the power source voltage.

As stated above, in the RAM circuit shown in FIG. 3, the voltage of (VCC+VTH) level is applied, during the precharge period, to the gates of the MOS transistors TR11 and TR12, which consequently are rendered conductive. As a result, the potential of the nodes N2 or N3 will not be kept at the (VCH−VTH) level. Therefore, no such problems as have occurred with the RAM circuit of FIG. 1 arise in the RAM circuit of FIG. 3.

On the other hand, in a case where the precharge period lapses and the precharge signal $\phi P$ is set at the "0" level, even if the amount of variation $\Delta VCC$ of the power source voltage VCC is greater than 2VTH causing the potentials of the bit lines B0 and B1 to decrease down toward the VCL level, the RAM circuit of the invention is not affected at all by the variation of the power source voltage. This is because, as stated in the description of the operation of the RAM circuit shown in FIG. 1, the sensing and amplifying operation of the radioless sense amplifier 2 is commenced before or immediately after the fluctuation of the power source voltage so that the potentials of the bit lines B0 and B1 may be sufficiently amplified or will not vary to a great extent.

In this way, in the memory cycle in or before which the power source voltage is varied, the potentials of the nodes N2 and N3 become substantially equal to the bit lines B0 and B1, respectively, so that the RAM circuit shown in FIG. 3 performs a stable operation independently of the variation in the power source voltage.

Further, even if, in the memory cycle in or before which the power source voltage is varied, the potentials of the nodes N2 and N3 are kept at specified levels, the transistors TR11 and TR12 are rendered conductive during the precharge period occurring after the lapse of this memory cycle with a result that the potentials of the nodes N2 and N3 become substantially equal to the potentials of the bit lines B0 and B1. Thus, the reading operation in a succeeding memory cycle is not affected at all by the variation of the power source voltage.

Further, when the power source voltage VCC has varied from the VCL level to the VCH level, the output signal from the control circuit 18 varies following the variation in that power source voltage. In this case, therefore, no problem arises as in the RAM circuit shown in FIG. 1.

The invention has been explained by describing its embodiment as above, but is not limited to this embodiment. For example, in the dynamic RAM circuit driven with a power source voltage of +5 V, a decrease in level of the "1" level signal on the I/O lines (not shown) connected to the terminals D0 and D1 may pose a problem. In such a case, it is possible to connect, as in the case of FIG. 3, the active pull-up circuits to the I/O lines.

Further, it is possible to use the active pull-up circuit of the invention with respect to a semiconductor circuit other than the dynamic RAM circuit in order to pull up a signal voltage on a signal line.

What is claimed is:

1. An active pull-up circuit comprising:
   a power source terminal connected for receiving a power source voltage;
   an input terminal connected for receiving a pull-up signal which is generated after a precharge period;
   capacitive means having a first end connected to said input terminal;
   a first MOS transistor having a current path connected between a second end of said capacitive means and a signal line;
   a second MOS transistor having a current path connected between said power source terminal and signal line and having a gate connected to a junction between said capacitive means and first MOS transistor, said signal line being precharged through said second MOS transistor to a power source voltage level during said precharge period; and
   control means for supplying a first output voltage to a gate of said first MOS transistor in response to a precharge signal which is generated during said precharge period, said first output voltage being kept higher than the sum of the power source voltage and a threshold voltage of said first MOS transistor, and supplying a second output voltage to the gate of said MOS transistor in response to a control signal which is generated after the lapse of said precharge period, said second output voltage being kept substantially equal to the power source voltage.

2. An active pull-up circuit according to claim 1, wherein said capacitive means is a MOS capacitor.

3. An active pull-up circuit comprising:
   a power source terminal connected for receiving a power source voltage;
   an input terminal connected for receiving a pull-up signal which is generated after a precharge period;
   capacitive means having a first end connected to said input terminal;
   a first MOS transistor having a current path connected between a second end of said capacitive means and a signal line;
   a second MOS transistor having a current path connected between said power source terminal and signal line and having a gate connected to a junction between said capacitive means and first MOS transistor, said signal line being precharged through said second MOS transistor to a power source voltage level during said precharge period; and
   control means including
      a third MOS transistor having its gate and drain connected to said power source terminal,
      a capacitor having one end connected to a source of said third MOS transistor and receiving at the other end a control signal which is generated after the lapse of said precharge period,
      a fourth MOS transistor having a gate connected to the source of said third MOS transistor, a source connected to the gate of said first MOS transistor and a drain connected to said power source terminal, and
      a capacitor having a first end connected to the source of said fourth MOS transistor and receiving at a second end a precharge signal which is generated during said precharge period, wherein said control means supplies to the gate of said first MOS transistor a voltage which, during said precharge period, is kept higher than the sum of the power source voltage and a threshold voltage of said first MOS transistor and, after the lapse of said precharge period, is kept substantially equal to the power source voltage.

* * * * *